United States Patent
Kerdoncuff et al.

(10) Patent No.: US 6,802,901 B2
(45) Date of Patent: Oct. 12, 2004

(54) METHOD OF MAKING HIGH PURITY OPTICAL FLUORIDE CRYSTALS

(75) Inventors: Alain Kerdoncuff, Vincennes (FR); Alexandre M. Mayolet, Auneau (FR)

(73) Assignee: Corning Incorporated, Corning, NY (US)

(*) Notice: Subject to any disclaimer, the term of this patent is extended or adjusted under 35 U.S.C. 154(b) by 55 days.

(21) Appl. No.: 10/198,526

(22) Filed: Jul. 18, 2002

(65) Prior Publication Data

US 2003/0089304 A1 May 15, 2003

(30) Foreign Application Priority Data

Jul. 20, 2001 (FR) .................................. 01 09710

(51) Int. Cl.[7] .................................. C30B 11/14
(52) U.S. Cl. .......................... 117/82; 117/81; 117/83
(58) Field of Search ................ 117/81, 82, 83

(56) References Cited

U.S. PATENT DOCUMENTS

| 3,372,126 A | 3/1968 | Vecchio et al. |
| 6,153,011 A | 11/2000 | Pandelisev .................. 117/200 |
| 6,238,479 B1 | 5/2001 | Oba et al. ..................... 117/68 |

FOREIGN PATENT DOCUMENTS

| EP | 1076117 A2 | 2/2001 |
| JP | 55121999 | 9/1980 |

*Primary Examiner*—Felisa Hiteshew
(74) *Attorney, Agent, or Firm*—Walter M. Douglas

(57) ABSTRACT

The present invention relates to the manufacturing of high purity optical flouride crystals, the making of purified optical flouride crystal feedstocks and to the anionic purification of optical fluoride crystalline materials. The invention relates generally to methods for removing oxide impurities from optical fluoride crystal feedstocks. More specifically, the invention relates to a method for preparing purified optical fluoride crystal feedstocks and the use of the feedstock in manufacturing VUV<200 nm transmission optical fluoride crystals for VUV lithography/laser systems.

30 Claims, 9 Drawing Sheets

METHOD OF MAKING HIGH PURITY OPTICAL FLUORIDE CRYSTALS

PRIORITY

This application claim the priority of French Application No. 0109710 filed Jul. 20, 2001 in the English language with the European Patent Office in France.

BACKGROUND OF INVENTION

1. Field of the Invention

The present invention relates to the manufacturing of high purity optical fluoride crystals, the making of purified optical fluoride crystal feedstocks and to the anionic purification of optical fluoride crystalline materials. The invention relates generally to methods for removing oxide impurities from optical fluoride crystal feedstocks. More specifically, the invention relates to a method for preparing purified optical fluoride crystal feedstocks and the use of the feedstock in manufacturing VUV<200 nm transmission optical fluoride crystals for VUV lithography/laser systems.

2. Background Art

Crystals of alkaline earth and alkali metal fluoride salts are useful materials because of their low-wavelength absorption edges. Crystals of fluoride salts such as $CaF_2$, $BaF_2$, $SrF_2$, LiF, $MgF_2$, and NaF are useful in applications that require high transmission in the vacuum ultraviolet (VUV) region, i.e., at wavelengths below 200 nm.

Fluoride crystals are commonly grown using the Bridgman-Stockbarger process, with fluoride crystal feedstocks loaded into a crucible which is disposed inside a hot zone of a vertical furnace. The hot zone is then heated to a temperature sufficient to melt the fluoride crystal feedstock raw material. After melting the fluoride crystal feedstock raw material, the crucible is slowly lowered from the hot zone to a cold zone. As the crucible passes from the hot zone to the cold zone the molten material goes through a zone of thermal gradient. On passing through this zone, the temperature transition inside the molten material creates a crystal front. The crystal front propagates inside the crucible, within the material, as long as the crucible is caused to move downwardly.

The starting materials (fluorides of alkali metals or of alkaline-earth metals) are found on the market with levels of cationic contamination of the order of a ppm. As regards the anionic contamination, these levels are generally higher: of the order of or higher than 100 ppm. Said anionic contamination of this type of material (fluorides of alkali metals or of alkaline-earth metals) is essentially due to oxygenated species. It is highly disadvantageous. $CaF_2$ and $BaF_2$, when they contain oxygen, present a very low transmission in the ultraviolet, with the oxide impurities in fluoride crystals having a degrading effect on VUV transmission of the crystals. The oxide impurities are attributed primarily to the reaction of water molecules with the fluorides and residual carbonates. Unfortunately, it is difficult to avoid oxide contamination in the crystals because water is ubiquitous. Water molecules are usually found in the raw material used in preparing the crystals as well as during the crystal growth process. A common strategy for reducing the oxide content in crystals is to react an oxide scavenger with the raw material prior to growing the crystal, i.e., prior to moving the melted raw material through a thermal gradient. This reaction may be carried out separately from the crystal growth process or as part of the crystal growth process. In a classical processes of preparation of monocrystals according to the Stockbarger technique solid compounds are incorporated such as $PbF_2$, $CdF_2$ or $ZnF_2$, for neutralising the oxygenated species present, which originate from the starting material incorporated and/or from the reaction environment. $PbF_2$ is the compound, called the fluorinating agent, which is the most used to this day insofar as its manipulation does not give rise to any particular difficulty, and insofar as it is solid at ambient temperature and insofar as it has, itself and its corresponding oxide (PbO), a high vapour pressure at the temperatures of use of the crystallisation furnaces. Said $PbF_2$ reacts, within the context of the preparation of crystals of $CaF_2$, notably according to the following reaction: $CaO + PbF_2 \rightarrow CaF_2 + PbO$.

However, the incorporation of $PbF_2$ and of its homologues, if it is beneficial with regard to the damage from the oxygenated species, it is furthermore disadvantageous. In fact, traces always remain of said solid compounds in the crystal and this consequently affects the transmission of said crystal and the homogeneity of its refractive index at below 200 nm.

SUMMARY OF INVENTION

The present invention provides a process of anionically purifying a feedstock powder of an optical fluoride crystal of an alkali metal or of an alkaline-earth metal; and a method of preparing an optical fluoride crystal of an alkali metal or of an alkaline-earth metal which includes, in its implementation, said process of feedstock anionic purification.

In one aspect, the invention relates to a method for making a below 200-nm wavelength transmitting optical fluoride crystal feedstock by anionically purifying a powder and the making of a below 200-nm wavelength transmitting optical fluoride crystal from the anionically purified feedstock.

In another aspect, the invention relates to a method for manufacturing an optical crystal for transmitting light of a wavelength less than 200 nm which comprises loading the anionically purified feedstock into a crucible, melting the anionically purified fluoride feedstock, and growing the crystal by moving the melted fluoride raw material through a thermal gradient.

In another aspect, the invention relates to a method for manufacturing an optical fluoride crystal for transmitting light of a wavelength less than 200 nm which comprises loading an anionically purified fluoride feedstock having a maximum oxygen content of less than 50 ppm of oxygen, less than 0.05 ppm of lead, and less than 5 ppm of other contaminants, such as the cationic contaminants, melting the anionically purified fluoride feedstock material having a maximum oxygen content of 50 ppm, and crystallizing the melted fluoride raw material to form a crystal having an internal transmission of at least 99%/cm at 157 nm.

In accordance with the present invention, an optimisation is in fact proposed of the mode of incorporation of reactive gas intended for purifying the feedstock material and the environment of their anionic impurities (oxygenated species).

Other features and advantages of the invention will be apparent from the following description and the appended claims.

DETAILED DESCRIPTION

Figure 1:
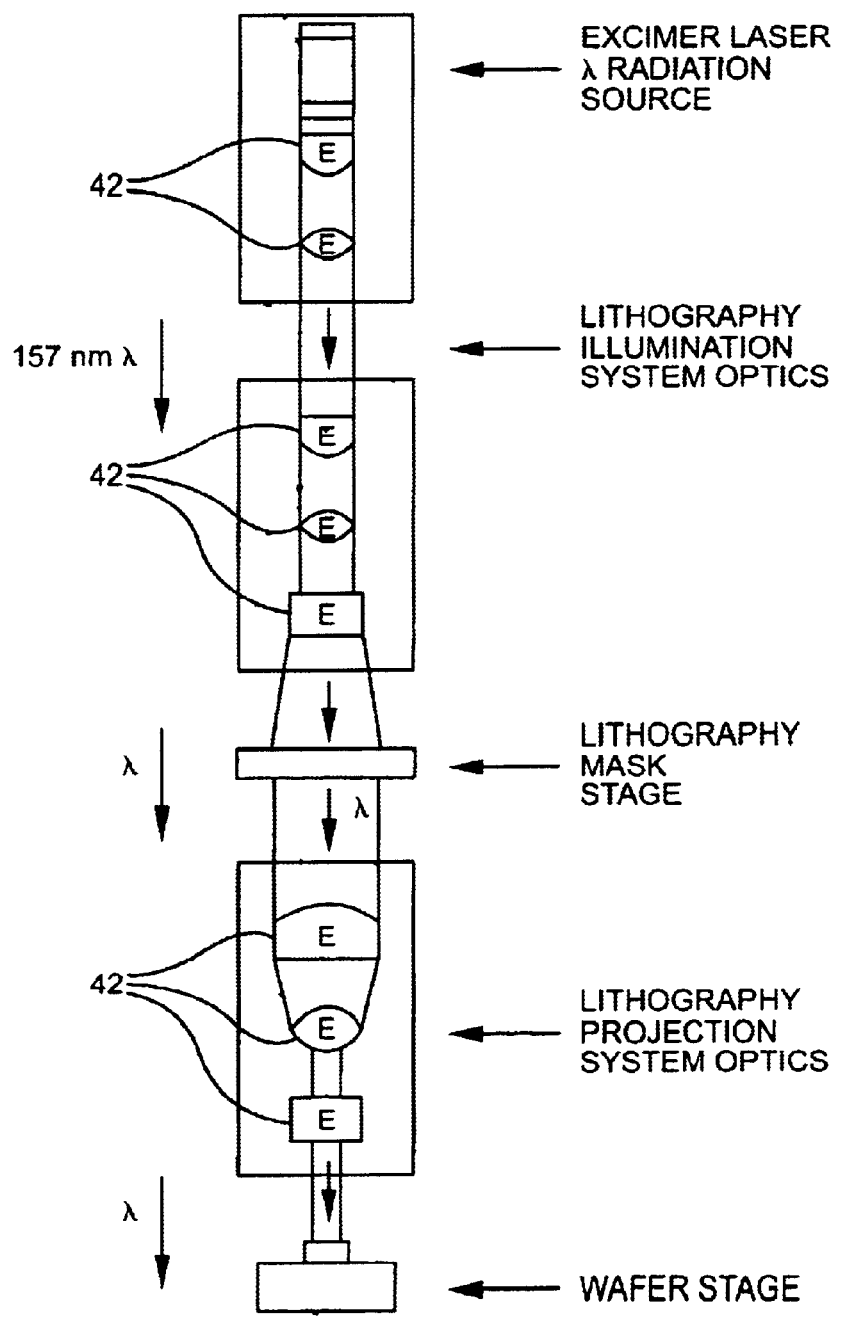
FIG. 1 shows an embodiment of the invention.
Figure 2:
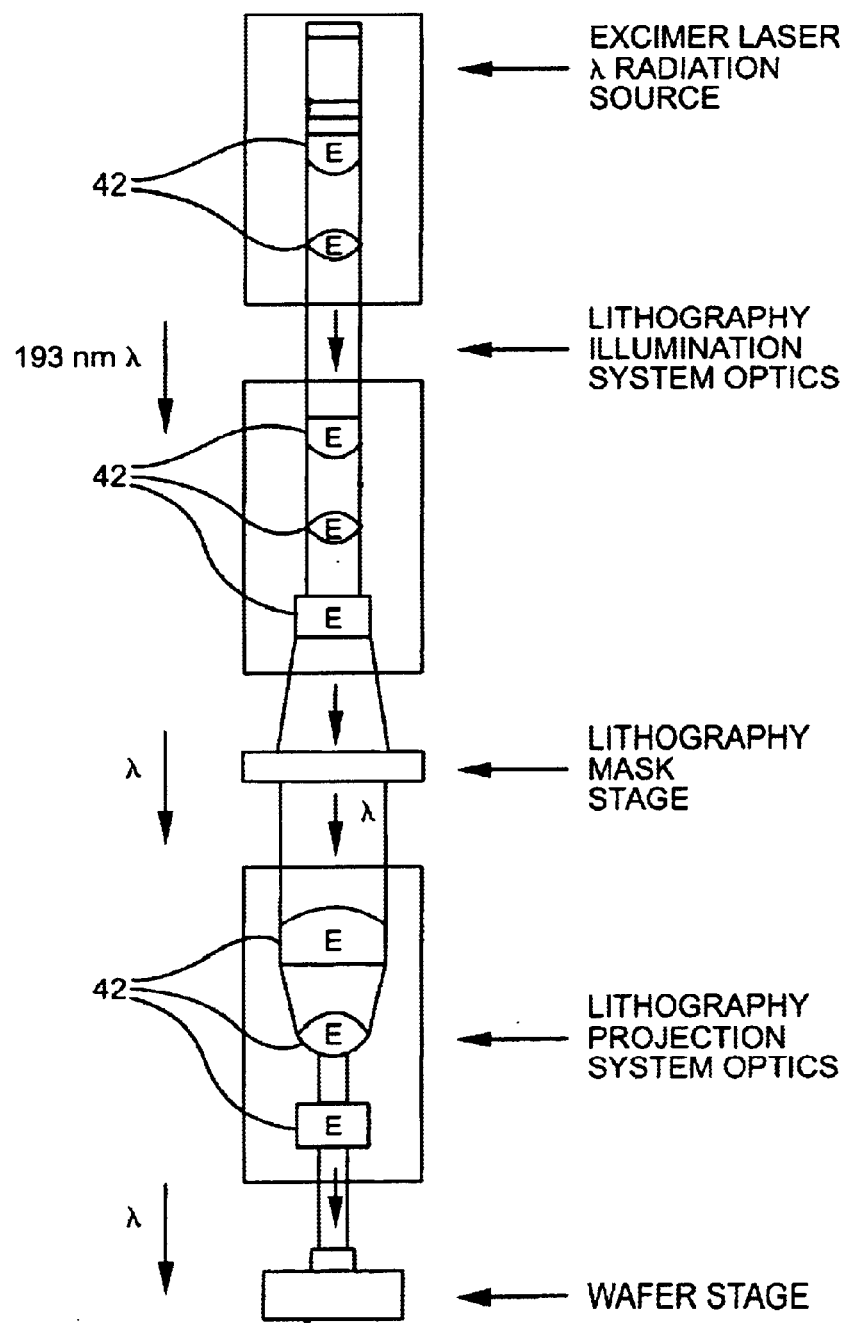
FIG. 2 shows an embodiment of the invention.

Embodiments of the invention provide a method for preparing a feedstock of alkaline earth and alkali metal fluorides. The feedstock prepared by the method of the invention is used for growing VUV<200 nm optical fluoride crystals, such as single crystals of $CaF_2$, $BaF_2$, $SrF_2$, LiF, $MgF_2$, and NaF and mixtures of these crystals, with preferred mixtures being mixtures of $CaF_2+BaF_2+SrF_2$, $CaF_2+BaF_2$, or $CaF_2+SrF_2$. Monocrystals of fluorides of alkali metals or of alkaline-earth metals (such as $CaF_2$, $BaF_2$, $MgF_2$, $SrF_2$, LiF) are required more and more pure for applications of various types. The invention includes methods of making VUV<200 nm optical lithography fluoride crystals and below 200 nm wavelength optical lithography elements E made therefrom for transmitting below 200 nm wavelength light such as $F_2$ excimer laser 157 nm output or an ArF excimer laser 193 nm output as shown in FIGS. 1–2. Preferably the method includes making a λ<200 nm optical lithography element 42 of high optical quality from a fluidized bed anionically purified optical fluoride crystal 20 having low oxygen, lead, and cationic contaminant levels. Thus, calcium fluoride ($CaF_2$) monocrystals are sought after, with optimal transmission characteristics, for the manufacture of lenses, used in lasers and lithography systems, at below 200 nm operating wavelengths of 193 nm and 157 nm. Similarly, the use of very pure barium fluoride is recommended, at 157 nm, for the chromatic correction of lithographic microsystems. $MgF_2$ is used for constructing ultraviolet laser windows; LiF for the constitution of ultraviolet laser windows. It is sought to obtain very pure optical fluoride crystal optical elements such as lenses in order to attain optimal transmissions.

Accordingly the present invention provides an optical fluoride crystal manufacturing process of anionically purifying a powder of a optical fluoride crystal feedstock raw material of an alkali metal or of an alkaline-earth metal, said process comprising placing said powder in contact with a reactive gas, at a temperature lower than the melting temperature of said fluoride.

Characteristically, within the context of the implementation of the optical fluoride crystal anionic purification of the invention, the powder/reactive gas contact is operated in a fluidised bed. The powder is placed in suspension in an ascending current of gas containing said reactive gas.

The anionic purification of the invention is thus a purification in relation to the oxygenated species: water, oxides, carbonates, nitrates. The anionic purification of the invention makes use of a reactive gas for removing said oxygenated species. The anionic purification of the present invention makes use of said reactive gas in an original manner. The powder to be purified is placed in suspension in a current of gas which contains said reactive gas; the purification is carried out in a fluidised bed. The powder to be purified/reactive gas contact is thus optimised.

The powder, due to its finely divided state, offers a large reaction surface area (1 $m^3$ of particles of 100 μm of average equivalent diameter takes up about 30,000 $m^3$). In a fluidised bed, all of this high reaction surface area is put perfectly in contact with the reactive gas. The bubbles of gas agitate the powder permanently, they even divide it even finer. Significant speeds of mass transfer are provided in accordance with the invention.

Incidentally, it is noted that said powder should stay in the divided state, i.e. in the powder state. It is thus preferred to operate the purification, as has been indicated, at a temperature lower than the melting temperature of the fluoride in question.

Figure 4:
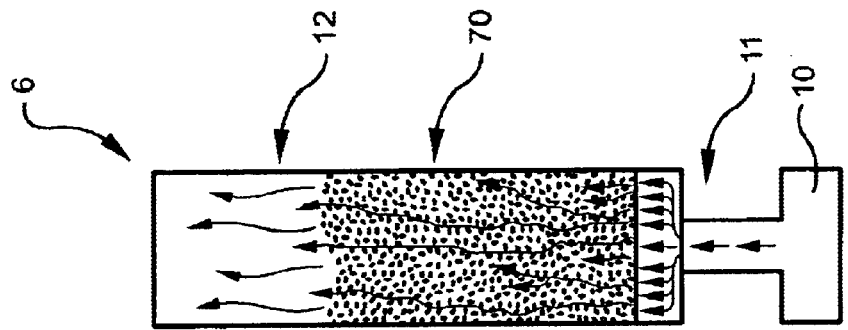
FIG. 4 shows an embodiment of the invention.
Figure 3:
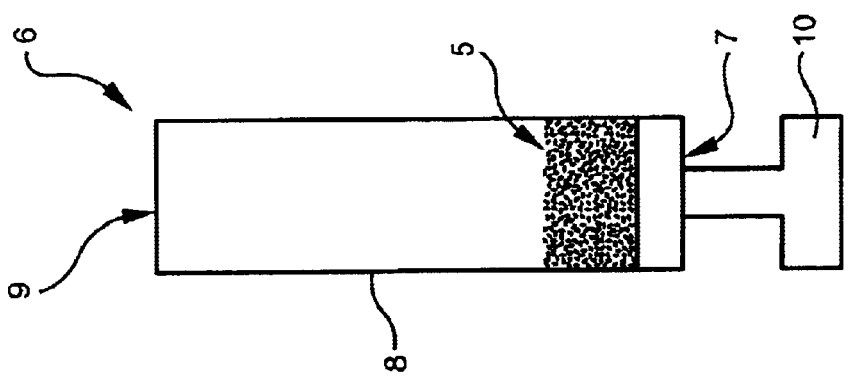
FIG. 3 shows an embodiment of the invention.
Figure 6:
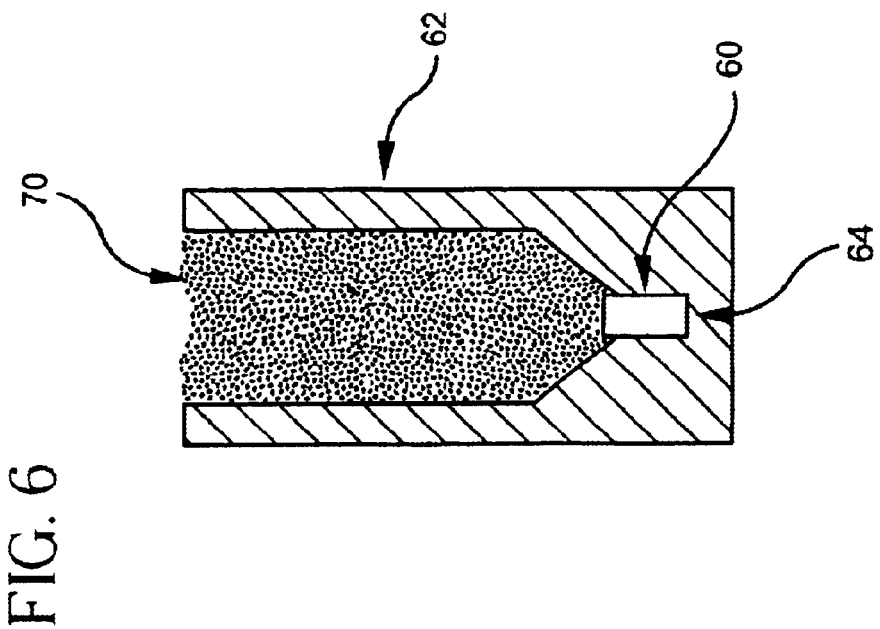
FIG. 6 shows an embodiment of the invention.
Figure 5:
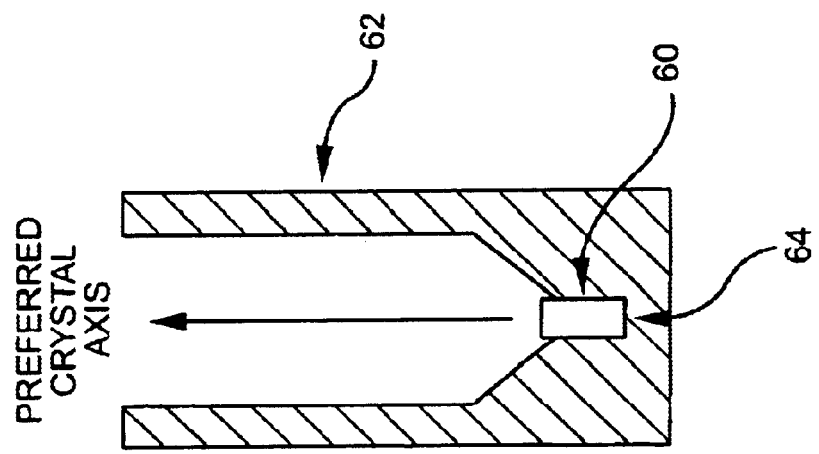
FIG. 5 shows an embodiment of the invention.
Figure 7:
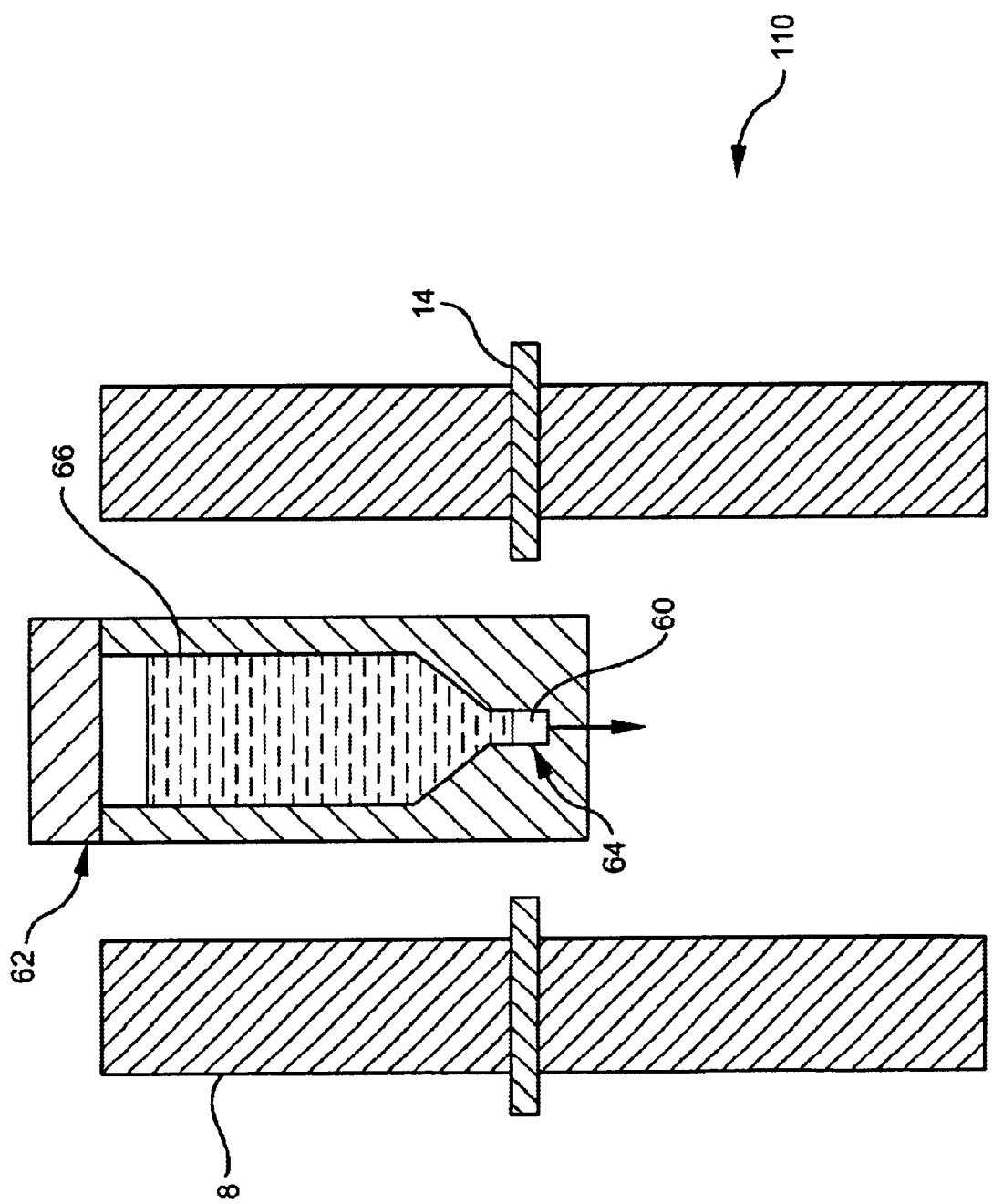
FIG. 7 shows an embodiment of the invention.
Figure 8:
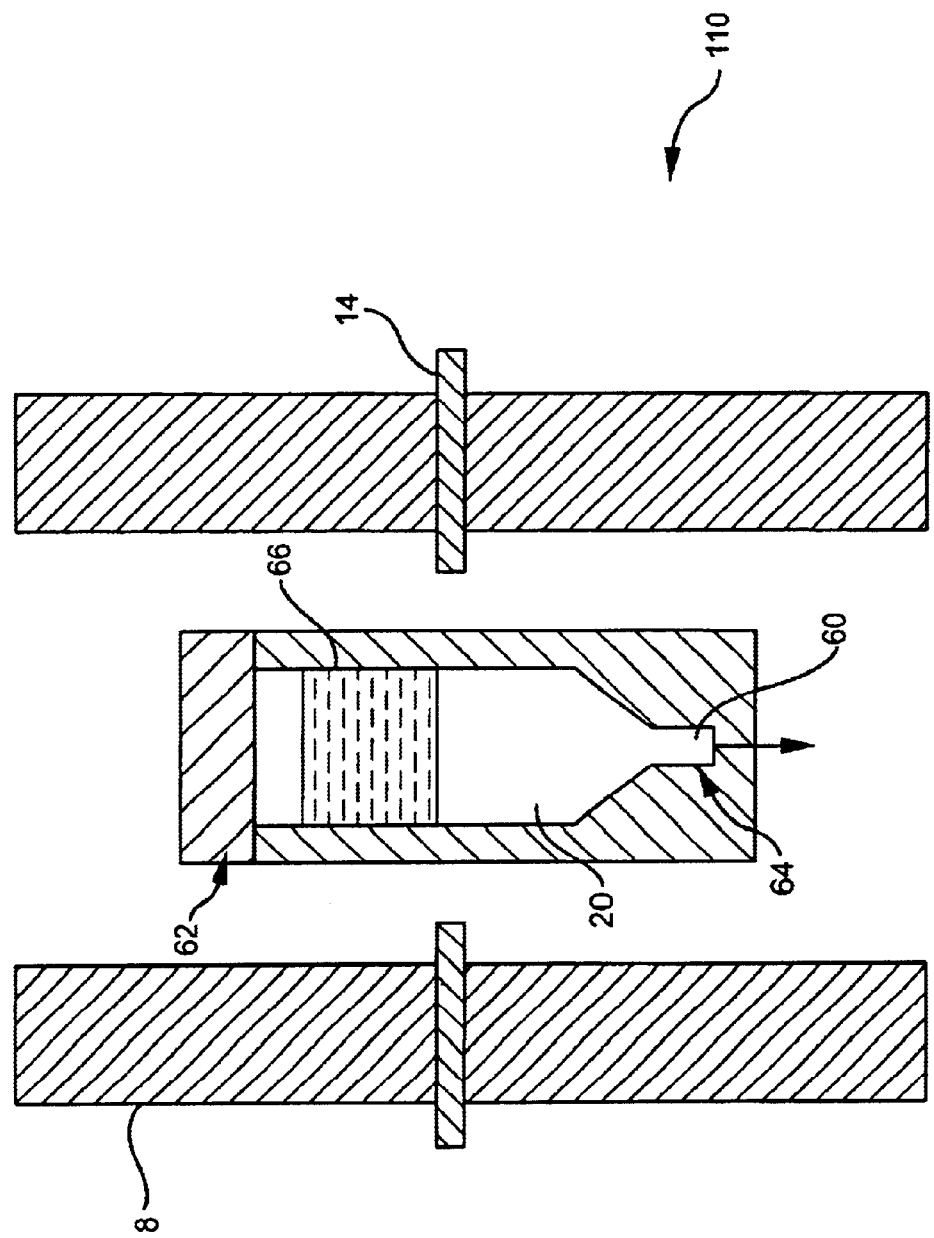
FIG. 8 shows an embodiment of the invention.
Figure 9:
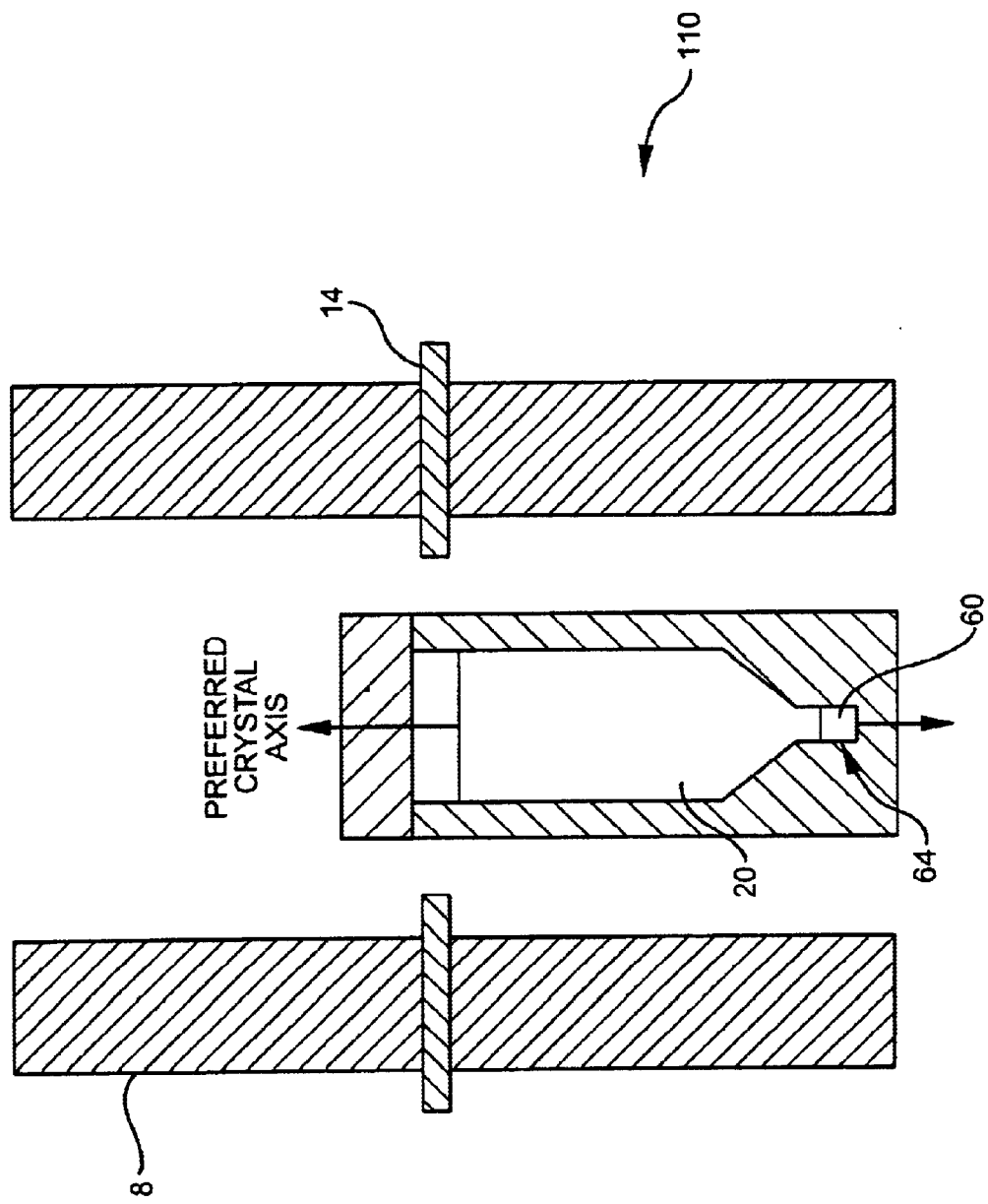
FIG. 9 shows an embodiment of the invention.
Figure 10:
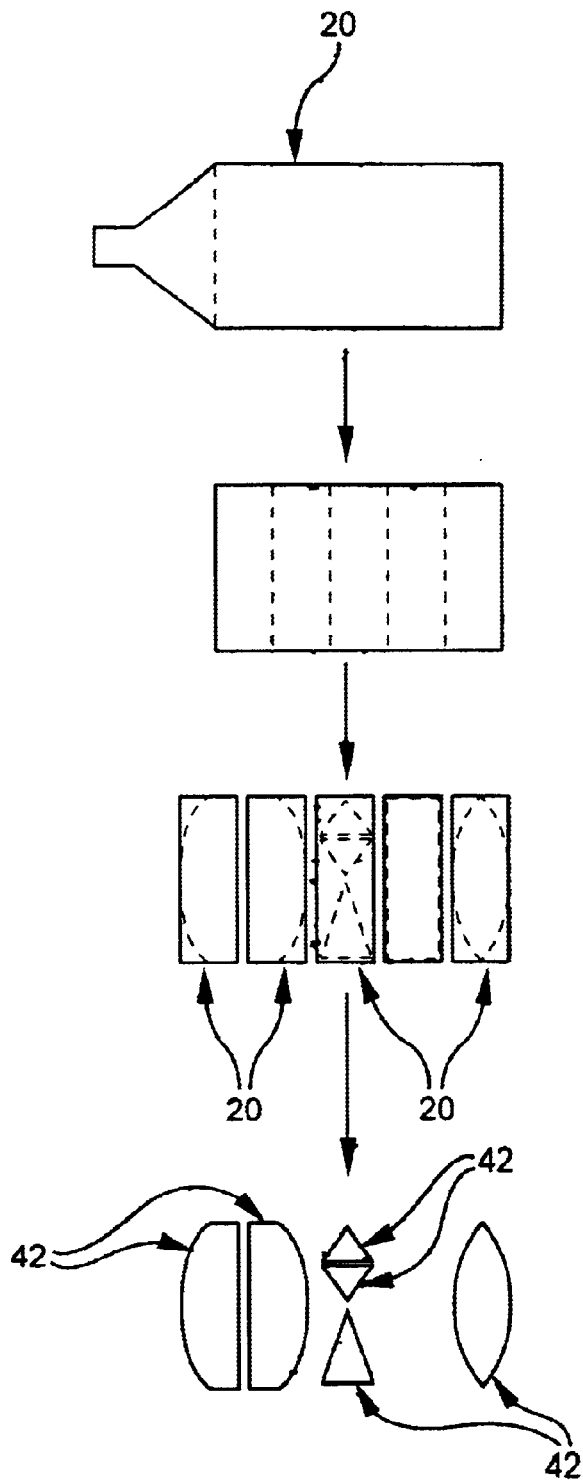
FIG. 10 shows an embodiment of the invention.
Figure 11:
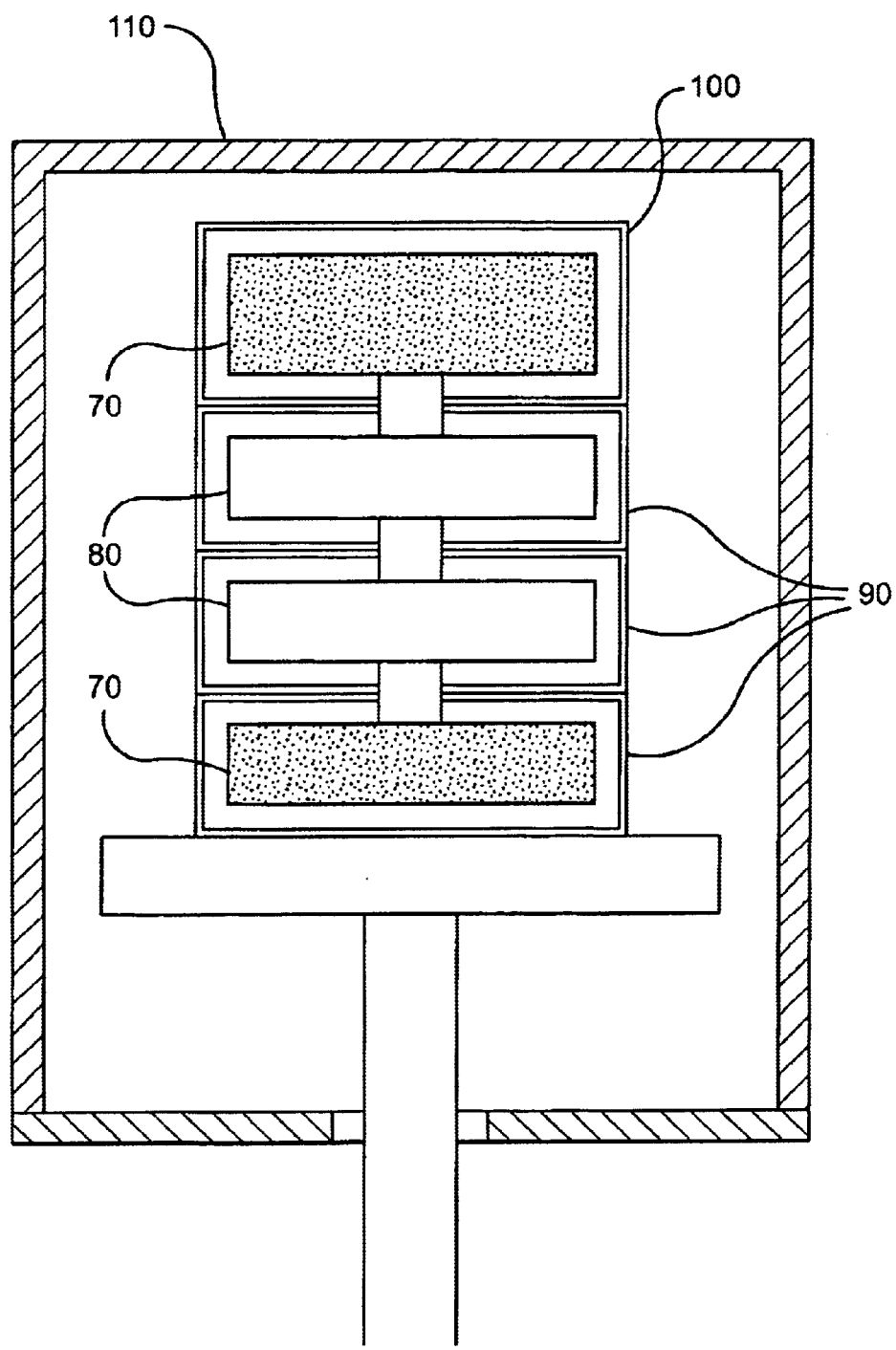
FIG. 11 shows an embodiment of the invention.

As shown in FIG. 3, the method of making an optical fluoride crystal includes providing an optical fluoride crystal powder 5 and providing a fluidised bed reactor 6 having a gas source inlet 7 and an internal wall 8 defining an optical fluoride crystal powder container 9. The method includes loading the optical fluoride crystal powder 5 into the fluidised bed reactor container 9 and providing a reactive gas 10 in fluid communication with the gas source inlet and fluidised bed reactor container. As shown in FIG. 4 the method includes anionically purifying the optical fluoride crystal powder with a flow 11 of gas inside said container with said optical fluoride crystal powder placed in suspension in an ascending current 12 of said flow of gas 11 including said reactive gas 10 to provide an anionically purified optical fluoride crystal feedstock 70. As shown in FIGS. 5–9, the method includes melting the anionically purified optical fluoride crystal feedstock 70 in a crucible 62 in a controlled atmosphere crystal growth oven furnace 110 to provide a melted feedstock 66 and growing an optical fluoride crystal 20 from the melted feedstock. As shown in FIG. 10, the optical fluoride crystal 20 is formed into optical elements 42. Preferably the anionically purified optical fluoride crystal feedstock 70 contains less than 50 ppm of oxygen by weight. Preferably the anionically purified optical fluoride crystal feedstock contains less than 0.05 ppm of lead (by weight). Preferably the anionically purified optical fluoride crystal feedstock has a cationic contaminant content less than 5 ppm (by weight). Preferably the grown optical fluoride crystal 20 has an internal transmission of at least 99%/cm at 157 nm. In an embodiment the optical fluoride crystal powder and said grown optical fluoride crystal are comprised of calcium fluoride. In an embodiment the optical fluoride crystal powder and said grown optical fluoride crystal are comprised of barium fluoride. In an embodiment the optical fluoride crystal powder and said grown optical fluoride crystal are comprised of magnesium fluoride. In an embodiment the optical fluoride crystal powder and said grown optical fluoride crystal are comprised of strontium fluoride. As shown in FIG. 11, the method includes embodiments where the anionically purified optical fluoride crystal feedstock 70 is loaded into stacked crucibles 100 and 90 along with previously melted densified fluoride crystal feedstock material disks 80, which preferably were obtained from melting of an anionically purified optical fluoride crystal feedstock. The reactive gas 10 preferably is a fluorinating gas. The reactive gas 10 preferably includes fluorine (F). In an embodiment the reactive gas is comprised of $CF_4$. In an embodiment the reactive gas is comprised of $BF_3$. In an embodiment the reactive gas is comprised of $F_2$. In an embodiment the reactive gas is comprised of $NF_3$. In an embodiment the reactive gas is comprised of $SF_6$. Preferably the optical fluoride crystal powder 5 has an average equivalent diameter between 10 and 500 μm.

The invention includes the method of making optical fluoride crystal feedstock 70. The method comprises providing an optical fluoride crystal powder 5, providing a fluidised bed reactor 6 having a gas source inlet 7 and an internal wall 8 defining an optical fluoride crystal powder container 9, loading said optical fluoride crystal powder 5 into said fluidised bed reactor container 9, providing a reactive gas 10 in fluid communication with said gas source inlet and fluidised bed reactor container, and anionically purifying said optical fluoride crystal powder with a flow 11 of gas inside said container with said optical fluoride crystal powder placed in suspension in an ascending current 12 of said flow of gas including said reactive gas 10 to provide an anionically purified optical fluoride crystal feedstock 70 having less than 50 ppm of oxygen. Preferably anionically fluidized bed purified optical fluoride crystal feedstock 70 contains less than 0.05 ppm of lead (by weight). Preferably anionically fluidized bed purified optical fluoride crystal feedstock 70 has a cationic contaminant content less than 5 ppm (by weight). In embodiments, such as shown in FIGS. 7–9 and 11, the furnace 110 is loaded with anionically fluidized bed purified optical fluoride crystal feedstock particulate 70 which can include a solid fluorinating agent such as lead fluoride. The anionically fluidized bed purified optical fluoride crystal feedstock particulate 70 is loaded into crystal growth furnaces 110 and is melted in the crucibles into a fluoride melt which is then grown into a fluoride crystal 20 by slowly cooling the melt within the crystal growth furnace, such as lowering through the thermal gradient in a Stockbarger crystal growth process. In embodiments of the invention shown in FIGS. 5–9, a growth crucible 62 having a preferred crystal axis oriented seed crystal 60 in a seed crystal receiver 64 is utilized. The crystal growth crucible containing the purified feedstock particulate 70 is loaded into an optical fluoride growth furnace 110, which includes a high temperature upper melt zone 8 and a thermal baffle 14 which provides a thermal gradient for crystal growth solidification. The anionically fluidized bed purified optical fluoride crystal feedstock loaded into crucible 62 is melted in the high temperature zone 8 of furnace 110 to form a fluoride melt 66. Fluoride optical crystal 20 is grown from the melt 66 by lowering through the crystal growth solidification zone of baffle 14 to provide optical fluoride crystal 20 for transmitting below 200 nm wavelengths. In a preferred embodiment the method includes making the preferred crystal axis oriented seed crystal 60 from a batch of anionically fluidized bed purified optical fluoride crystal feedstock 70, preferably with the anionically fluidized bed purified optical fluoride crystal feedstock 70 utilized throughout the crystal manufacturing process.

According to an implementation variant, the gas flow ascending current containing the reactive gas, which is responsible for placing the powder in suspension, consists of said reactive gas which is pure (nondiluted).

According to an implementation variant, said gas flow ascending current containing the reactive gas, which is responsible for placing the powder in suspension, comprises said reactive gas which is diluted (to a given concentration) in an inert gas. It is obviously suitable that the diluting gas does not come to pollute (oxidise) the fluoride undergoing purification. The incorporation of argon, helium, neon, xenon, nitrogen, even a mixture of these inert gases, is recommended in a non-limiting way as the diluting gas.

The reactive gas which is used, alone or in a mixture with at least one inert gas, is generally a fluorinating gas. Advantageously, it is selected from $BF_3$, $F_2$, $NF_3$, $SF_6$, $CF_4$, and their mixtures. The use of other fluorinating gases, such as $CHF_3$ and $CH_2F_2$, is not however excluded. In any case, the use of the fluorinating gases listed above is preferred. More particularly, the incorporation of $F_2$, $NF_3$, $SF_6$ and $CF_4$ is preferred, and by far, the use is preferred of $CF_4$, which is a non-toxic gas, and which can be used at 100° C., as well as at temperatures higher than 100° C.

The field of application of the process of the invention extends to powders of fluoride crystals of an alkali metal or of an alkaline-earth metal. Said process is more particularly suited for anionically purifying (with regard to the oxygenated species) powders of calcium fluoride ($CaF_2$), barium fluoride ($BaF_2$), magnesium fluoride ($MgF_2$) and strontium fluoride ($SrF_2$).

The powders, purified in accordance with the invention, possess a particle size which is compatible to their placement in fluidised bed. The powders are generally based on beads the average equivalent diameter of which is between 10 and 500 $\mu$m. Advantageously, they are based on beads of from a hundred to several hundreds of micrometers (100–500 micrometers).

The implementation of the purification process according to the invention preferably includes a fluidised bed system of a reactor linked to a gas source inlet, equipped with means of delivery of said gas into its interior part. The material constituting said reactor (at least its internal walls) is compatible with the powder and the reactive gas. It must also resist to the temperatures of implementation of the purification reaction, temperatures which are generally between 100 and 1,400° C. In an embodiment the reactor (at least its internal walls) is comprised of graphite. Said reaction temperature is fixed from case to case, in obviously taking into account the nature of the fluorine containing reactive gas incorporated and of its reactivity. It is preferred that said reaction temperature lies imperatively lower (preferably at least 50° C. lower, more preferably at least 100° C.) than the melting temperature of the fluoride crystal material constituting the powder in question.

The capacity of the reactor can vary over a wide range. The purification process of the invention is in fact particularly interesting in that its implementation on different scales (laboratory scale, pilot scale, industrial scale) do not give rise to any particular difficulty. The purification process of the invention can in fact be implemented on several kilograms of powder as well as on a tonne of said powder.

The person skilled in the art has already grasped all the significance of the process of the invention. It avoids any contamination of the treated powder, its efficiency is certain insofar as the powder/reactive gas contact is optimised, it can be implemented without any particular difficulty on a small or large scale.

Said purification process of the invention generates batches of purified fluoride which can be treated—by melting and cooling—in order to obtain (mono)crystals. Said batches can be melted directly in the purification reactor after stopping the inlet of reactive gas, or can be transferred into a furnace oven in order to be melted therein.

In accordance with its secondary object, the present invention relates to a method of preparing a crystal, (a (mono)crystal) from a powder of a fluoride of an alkali metal or of an alkaline-earth metal, which comprises, successively:

anionically purifying said powder to provide a fluidised bed anionically purified optical fluoride crystal feedstock;

melting said fluidised bed anionically purified optical fluoride crystal feedstock; and growing a below 200 nm transmitting optical fluoride crystal from the melted fluidised bed anionically purified optical fluoride crystal feedstock.

Characteristically, within the context of the present invention, the anionic purification comprises carrying out the feedstock process of anionic purification in a fluidised bed.

This implementation can be done upstream, for example on the premises of the supplier of the powder and/or in the optical fluoride crystal melting oven furnace, prior to carrying out said melting. Thus, the operations of anionic purification and of melting of the powder can be implemented successively in a single, sole device; the melting obviously being initiated only after the stopping of the inlet of the reactive gas used for carrying out the purification, in order to generate the fluidised bed. It is thus possible to successively implement, within the melting oven:

an anionic purification of the powder in a fluidised bed;

melting said powder, under vacuum or under an inert atmosphere, after stopping the inlet to said oven of the ascending gas current which is responsible for said fluidised bed, which contains the reactive purifying gas.

The melted purified powder is then transferred into an oven for growing the (mono)crystal for the classical implementation of said growth.

The person skilled in the art will have grasped all the significance of the present invention. The process claimed enable fluidised bed anionically purified optical fluoride crystal feedstock powders and crystals therefrom to be obtained which have very low levels of contamination, and which notable contain less than 50 ppm of oxygen, less than 0.05 ppm of lead, and less than 5 ppm of other contaminants, such as the cationic contaminants.

The crystals in question have thus an excellent transmission in the ultra-violet below 200 nm.

It will be apparent to those skilled in the art that various modifications and variations can be made to the present invention without departing from the spirit and scope of the invention. Thus it is intended the the present invention cover the modifications and variations of this invention provided they come within the scope of the appended claims and their equivalents.

What is claimed is:

1. A process of anionically purifying a powder of a fluoride of an alkali metal or of an alkaline-earth metal, comprising placing said powder in contact with a reactive gas, at a temperature lower than the melting temperature of said fluoride, wherein said contact is operated in a fluidised bed; said powder being placed in suspension in an ascending current of gas containing said reactive gas.

2. The process according to claim 1, wherein said gas containing said reactive gas consists of said reactive gas.

3. The process according to claim 1, wherein said gas containing said reactive gas comprises said reactive gas diluted in an inert gas.

4. The process according to claim 1, wherein said reactive gas is a fluorinating gas.

5. The process according to claim 4, wherein said reactive gas is selected from $BF_3$, $F_2$, $NF_3$, $SF_6$, $CF_4$, and their mixtures.

6. The process according to claim 1, c wherein said powder is a powder of calcium fluoride ($CaF_2$), of barium fluoride ($BaF_2$) of magnesium fluoride ($MgF_2$), or of strontium fluoride ($SrF_2$).

7. The process according to claim 1, wherein said powder is based on beads the average equivalent diameter of which is between 10 and 500 µm.

8. The process according to claim 1, wherein it is carried out upon batches of powder of several kilograms to 1 tonne.

9. A method of preparing a crystal from a powder of a fluoride of an alkali metal or of an alkaline-earth metal, successively comprising:

anionically purifying said powder;

melting said purified powder;

growing the crystal, by cooling said melted purified powder;

wherein said purification comprises carrying out the process of claim 1.

10. The process according to claim 9, wherein said purification and melting of the powder are carried out successively in the same device; said melting being initiated only after stopping the inlet of the reactive gas used for carrying out the purification.

11. A method of making an optical fluoride crystal, said method comprising:

providing an optical fluoride crystal powder, providing a fluidised bed reactor, said reactor having a gas source inlet and an internal wall defining an optical fluoride crystal powder container, loading said optical fluoride crystal powder into said fluidised bed reactor container, providing a reactive gas in fluid communication with said gas source inlet and fluidised bed reactor container, anionically purifying said optical fluoride crystal powder with a flow of gas inside said container with said optical fluoride crystal powder placed in suspension in an ascending current of said flow of gas including said reactive gas to provide an anionically purified optical fluoride crystal feedstock, melting said anionically purified optical fluoride crystal feedstock to provide a melted feedstock, and growing an optical fluoride crystal from the melted feedstock.

12. A method as claimed in claim 11 wherein said anionically purified optical fluoride crystal feedstock contains less than 50 ppm of oxygen (by weight).

13. A method as claimed in claim 11 wherein said anionically purified optical fluoride crystal feedstock contains less than 0.05 ppm of lead (by weight).

14. A method as claimed in claim 11 wherein said anionically purified optical fluoride crystal feedstock has a cationic contaminant content less than 5 ppm (by weight).

15. A method as claimed in claim 11 wherein said grown optical fluoride crystal has an internal transmission of at least 99%/cm at 157 nm.

16. A method as claimed in claim 11 wherein said optical fluoride crystal powder and said grown optical fluoride crystal are comprised of calcium fluoride.

17. A method as claimed in claim 11 wherein said optical fluoride crystal powder and said grown optical fluoride crystal are comprised of barium fluoride.

18. A method as claimed in claim 11 wherein said optical fluoride crystal powder and said grown optical fluoride crystal are comprised of magnesium fluoride.

19. A method as claimed in claim 11 wherein said optical fluoride crystal powder and said grown optical fluoride crystal are comprised of strontium fluoride.

20. A method as claimed in claim 11 wherein said reactive gas is a fluorinating gas.

21. A method as claimed in claim 11 wherein said reactive gas includes fluorine.

22. A method as claimed in claim 11 wherein said reactive gas is comprised of $CF_4$.

23. A method as claimed in claim 11 wherein said reactive gas is comprised of $BF_3$.

24. A method as claimed in claim 11 wherein said reactive gas is comprised of $F_2$.

25. A method as claimed in claim 11 wherein said reactive gas is comprised of $NF_3$.

26. A method as claimed in claim 11 wherein said reactive gas is comprised of $SF_6$.

27. A method as claimed in claim 11 wherein said optical fluoride crystal powder has an average equivalent diameter between 10 and 500 μm.

28. A method of making an optical fluoride crystal feedstock, said method comprising:

providing an optical fluoride crystal powder, providing a fluidised bed reactor, said reactor having a gas source inlet and an internal wall defining an optical fluoride crystal powder container, loading said optical fluoride crystal powder into said fluidised bed reactor container, providing a reactive gas in fluid communication with said gas source inlet and fluidised bed reactor container, and anionically purifying said optical fluoride crystal powder with a flow of gas inside said container with said optical fluoride crystal powder placed in suspension in an ascending current of said flow of gas including said reactive gas to provide an anionically purified optical fluoride crystal feedstock having less than 50 ppm of oxygen.

29. A method as claimed in claim 28 wherein said anionically purified optical fluoride crystal feedstock contains less than 0.5 ppm of lead (by weight).

30. A method as claimed in claim 28 wherein said anionically purified optical fluoride crystal feedstock has a cationic contaminant content less than 5 ppm (by weight).

* * * * *